(12) United States Patent
Ji et al.

(10) Patent No.: US 11,206,736 B1
(45) Date of Patent: Dec. 21, 2021

(54) CONNECTION SUBSTRATE AND INTERPOSER SUBSTRATE INCLUDING THE SAME

(71) Applicant: SAMSUNG ELECTRO-MECHANICS CO., LTD., Suwon-si (KR)

(72) Inventors: Yun Je Ji, Suwon-si (KR); Yong Hoon Kim, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/206,553

(22) Filed: Mar. 19, 2021

(30) Foreign Application Priority Data

Dec. 28, 2020 (KR) .................. 10-2020-0184276

(51) Int. Cl.
| | |
|---|---|
| *H05K 1/18* | (2006.01) |
| *H05K 1/02* | (2006.01) |
| *H05K 1/14* | (2006.01) |
| *H05K 9/00* | (2006.01) |

(52) U.S. Cl.
CPC ............ *H05K 1/14* (2013.01); *H05K 1/0218* (2013.01); *H05K 1/181* (2013.01); *H05K 9/0022* (2013.01); *H05K 2201/09236* (2013.01); *H05K 2201/09981* (2013.01); *H05K 2201/2018* (2013.01)

(58) Field of Classification Search
CPC .. H05K 1/14; H05K 1/148; H05K 1/181–189; H05K 1/0218–0227
See application file for complete search history.

(56) References Cited

U.S. PATENT DOCUMENTS

2020/0205289 A1    6/2020   Iida et al.

FOREIGN PATENT DOCUMENTS

| KR | 10-2019-0139653 A | 12/2019 |
| WO | 2019/069637 A1 | 4/2019 |

*Primary Examiner* — Jeremy C Norris
(74) *Attorney, Agent, or Firm* — Morgan, Lewis & Bockius LLP

(57) ABSTRACT

An interposer substrate includes a metal member; and a connection substrate disposed on at least portion of one side surface of the metal member. The connection substrate includes circuit patterns exposed from each of one surface of the connection substrate and the other surface of the connection substrate opposing the one surface, and one of a plurality of side surfaces of the connection substrate connecting one side and the other side of the connection substrate is attached to at least a portion of the one side surface of the metal member.

20 Claims, 11 Drawing Sheets

CONNECTION SUBSTRATE AND INTERPOSER SUBSTRATE INCLUDING THE SAME

CROSS-REFERENCE TO RELATED APPLICATION(S)

This application claims benefit of priority to Korean Patent Application No. 10-2020-0184276 filed on Dec. 28, 2020 in the Korean Intellectual Property Office, the disclosure of which is incorporated herein by reference in its entirety.

TECHNICAL FIELD

The present disclosure relates to a connection substrate and an interposer substrate including the same.

BACKGROUND

An area occupied by a main board continues to decrease in size due to an increase in an area of a camera and an increase in an area of a battery of a smartphone. On the other hand, as functions are diversified, the number of components to be mounted on the main board is increasing, and thus the main board is being layered in plural.

However, looking at a current multilayer structure, an area occupied by the interposer is significantly large, which results in reducing an effect of increasing amounting area due to the multilayer structure, and the cost of manufacturing the interposer is also significant. In addition, a warpage problem is large due to shape characteristics of the interposer with a large empty center.

SUMMARY

An aspect of the present disclosure may provide a connection substrate and an interposer substrate including the same capable of reducing a mounting area occupied by the connection substrate and/or the interposer substrate.

An aspect of the present disclosure may provide a connection substrate advantageous for electromagnetic interference (EMI) shielding and an interposer substrate including the same.

According to an aspect of the present disclosure, an interposer substrate may include a metal member; and a connection substrate disposed on at least portion of one side surface of the metal member. The connection substrate may include circuit patterns exposed from each of one surface of the connection substrate and the other surface of the connection substrate opposing the one surface, and one of a plurality of side surfaces of the connection substrate connecting one side and the other side of the connection substrate may be attached to at least a portion of the one side surface of the metal member.

According to another aspect of the present disclosure, a connection substrate may include a core layer; a circuit pattern and a ground pattern disposed on one surface and the other surface of the core layer, respectively; and first and second protective layers disposed on the one surface and the other surface of the core layer, respectively, to cover the circuit pattern and the ground pattern, respectively wherein the second protective covers the remaining surfaces except for a surface in contact with the other surface of the core layer among outer surfaces of the ground pattern, and at least a portion of the circuit pattern may be exposed through at least a portion of each of two opposing side surfaces of the connection substrate.

According to another aspect of the present disclosure, an interposer substrate may include a metal member including a first portion and a second portion bent with respect to the first portion; and a connection substrate disposed on the first portion. The connection substrate may include circuit patterns exposed from each of one surface of the connection substrate and the other surface of the connection substrate opposing the one surface, the connection substrate may further include a ground pattern, and the circuit patterns may be disposed between the ground pattern and the first portion.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Figure 1:
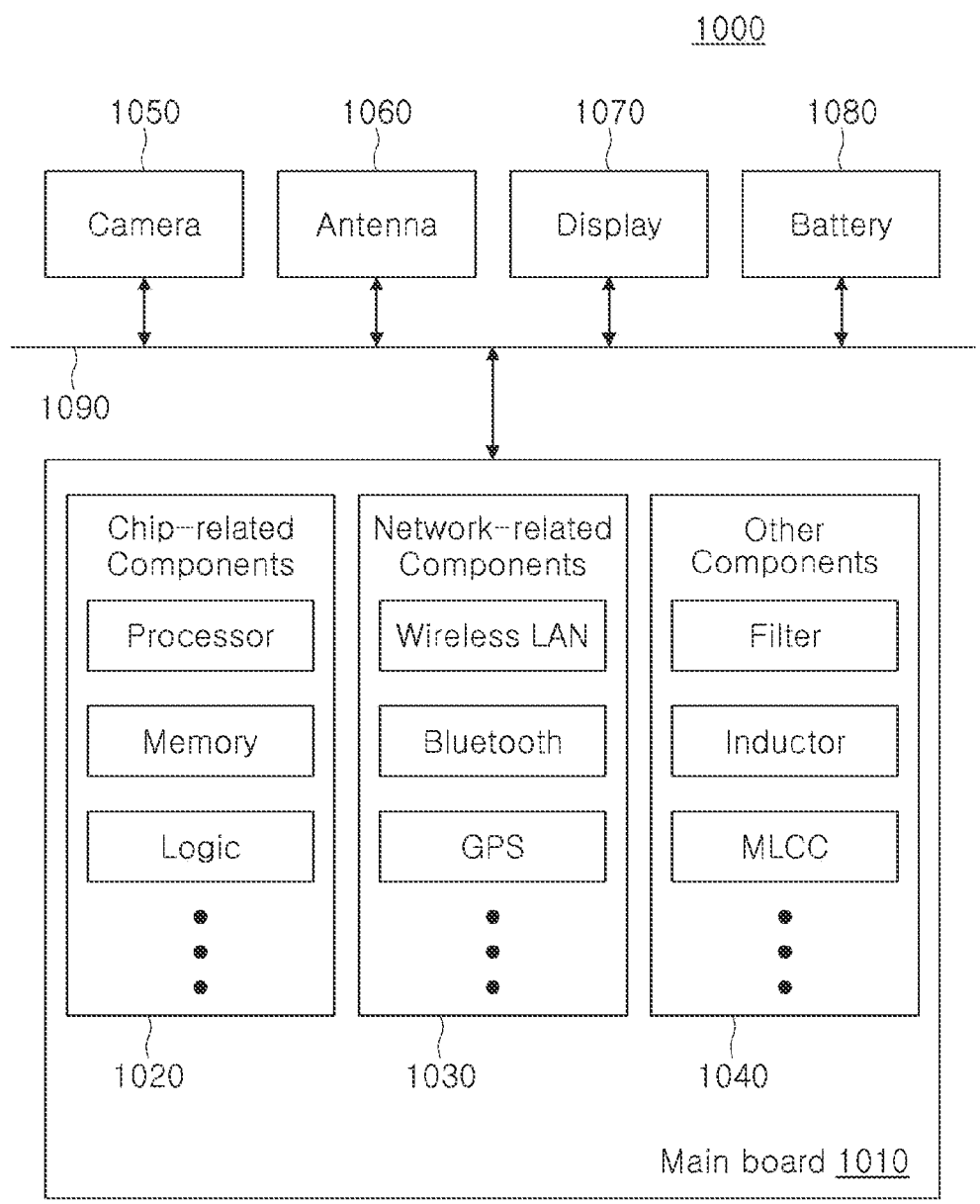
FIG. 1 is a block diagram illustrating an example of an electronic device system.

FIG. 1 is a block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically and/or electrically connected thereto. These components may be connected to others to be described below to form various signal lines 1090.

The chip-related components 1020 may be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an ADC converter, an ASIC, or the like. However, the chip-related components 1020 are not limited thereto, and other types of chip-related components may be included in addition to such chips. In addition, these chip-related components may also be combined with each other. The chip-related components 1020 may be in the form of a package including the above-described chips.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with the chip-related components 1020 and provided in the form of a package.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components in the form of a chip component used for various other purposes, and the like. In addition, other components 1040 may be combined with the chip-related components 1020 and/or the network-related components 1030 and provided in the form of a package.

Depending on a type of the electronic device 1000, the electronic device 1000 may include other electronic components that may or may not be physically and/or electrically connected to the main board 1010. Examples of other electronic components may include a camera module 1050, an antenna module 1060, a display 1070, a battery 1080, and the like. However, other electronic components are not limited thereto, and may also include an audio codec, a video codec, a power amplifier, a compass, an accelerometer, a gyroscope, a speaker, a mass storage device (e.g., a hard disk drive), a compact disk (CD), a digital versatile disk (DVD), and the like. In addition, other electronic components used for various purposes may be included according to the type of the electronic device 1000.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device that processes data.

Figure 2:
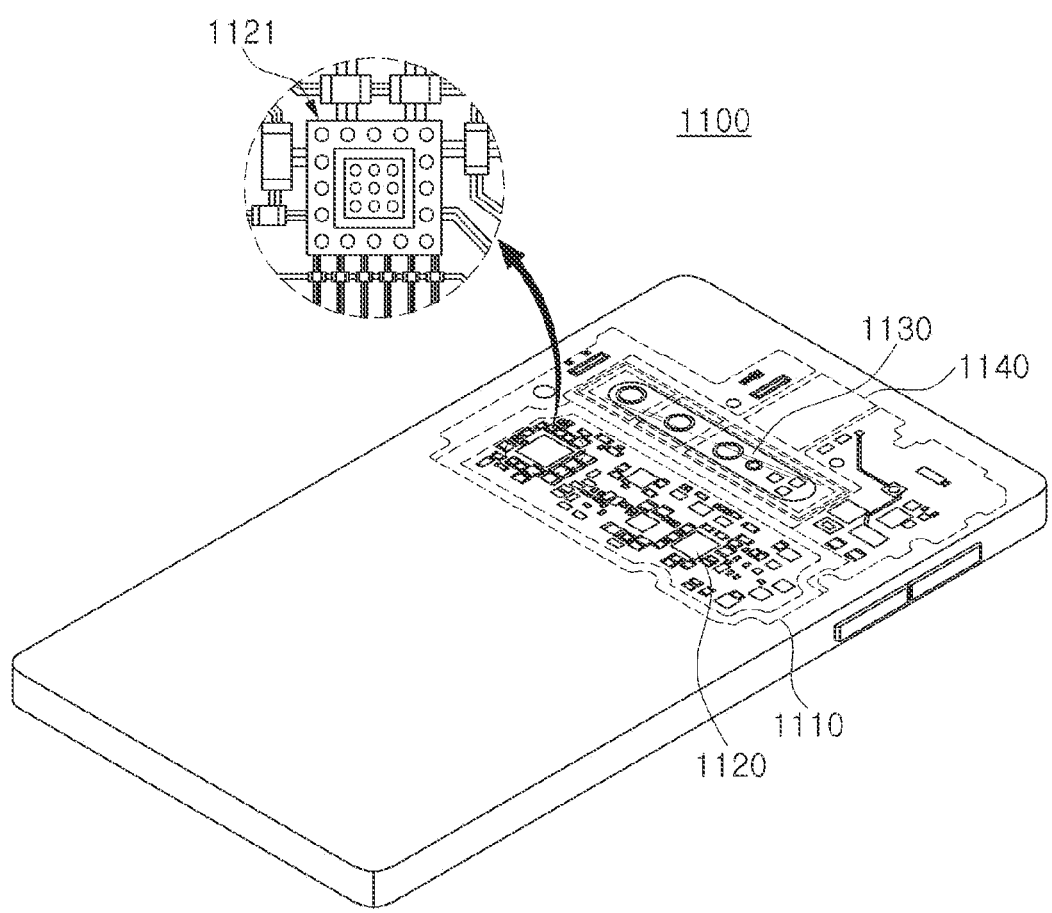
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various electronic components 1120 may be physically and/or electrically connected to the motherboard 1110. In addition, a camera module 1130 and/or a speaker 1140 may be accommodated in the smartphone 1100. Some of the electronic components 1120 may be the chip-related components described above, for example, an electronic component embedded substrate 1121, but are not limited thereto. The electronic component embedded substrate 1121 may be in a form in which an electronic component is embedded in a multilayer printed circuit board, but is not limited thereto. On the other hand, the electronic device is not necessarily limited to the smartphone 1100, but may be other electronic devices as described above.

Figure 3:
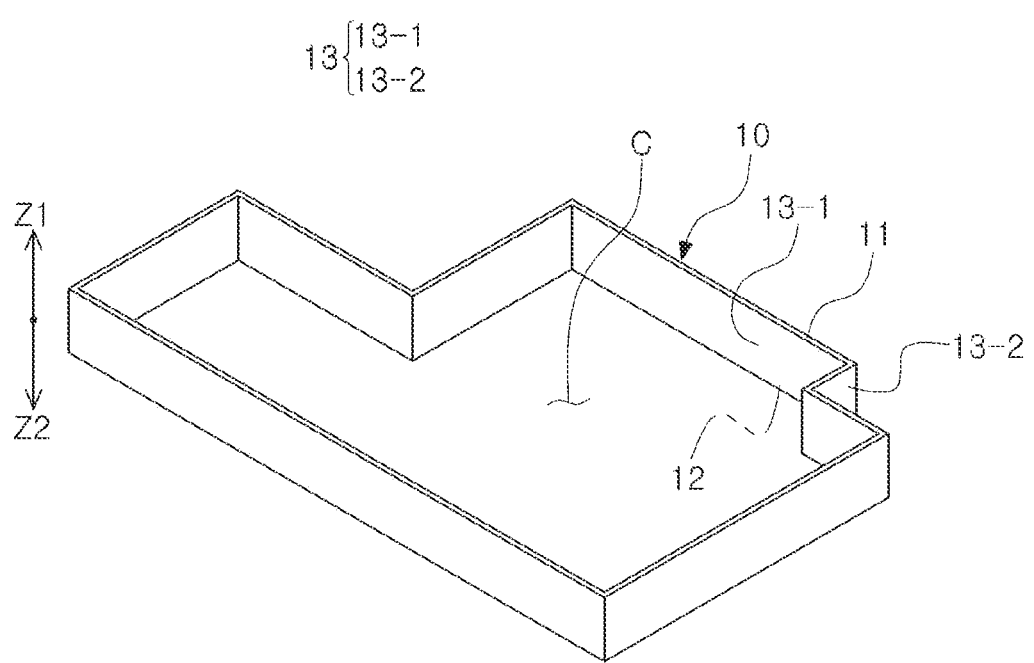
FIG. 3 is a schematic cross-sectional view illustrating an example of a metal member included in an interposer substrate.

FIG. 3 is a schematic cross-sectional view illustrating an example of a metal member included in an interposer substrate.

A metal member 10 may have a first surface 11 perpendicular to a first direction (e.g., direction component 'Z1'), a second surface 12 perpendicular to a second direction (e.g., direction component 'Z2'), and a plurality of side surfaces 13 perpendicular to a third direction different from each of the first and second directions. Here, the first direction may be a direction parallel to the direction component 'Z1' illustrated in FIG. 3, and the second direction may be a direction parallel to the direction component 'Z2' illustrated in FIG. 3. In addition, the direction component Z1 may represent substantially the same direction as a positive direction of a z-axis of a coordinate axis below, and the direction component Z2 may represent the same direction as a negative direction of the z-axis of the coordinate axis and may represent a direction opposite to the positive direction of the z-axis.

According to an exemplary embodiment, the first direction may face the top or bottom surface of the electronic device 1000 described above in FIGS. 1 and 2.

The metal member 10 according to an example is a stripe-shaped member in which the plurality of side surfaces extend in one direction, respectively, and are interconnected, and may surround an internal space C of a laminated printed circuit board (PCB) substrate. In addition, since the metal member 10 is manufactured in the above-described stripe shape, an internal space or cavity C may be formed. The side surfaces of the metal member 10 may be disposed in the stripe shape to function as a shielding surface that shields the internal space C from electromagnetic interference.

According to an exemplary embodiment, the metal member 10 may form a closed-loop structure as illustrated in FIG. 3. In addition, the metal member 10 may extend in a shape corresponding to a shape of a circuit board to be disposed below or above. For example, when the circuit board is formed in a rectangular shape, the metal member 10 may also have a rectangular frame structure, and unlike as illustrated in the drawing, when the circuit board has a shape of '⊓' or '⊔' structure, the metal member 10 forms a closed loop structure, but may also have a shape of a shape of '⊓' or '⊔' as a whole, that is, a step.

Meanwhile, the internal space surrounded by the metal member 10 may be substantially sealed by the metal member 10 having the closed loop structure as described above, but if the EMI or noise shielding effect due to the metal member 10 is ensured, fine grooves or slits exist so that the metal member 10 may have a shape in which at least a portion of the closed loop structure is cut. Accordingly, a portion of the metal member 10 may have a structure that is not sealed.

A material of the metal member 10 may be an alloy such as stainless steel (STS) or Invar, but is not limited thereto, and any metal or alloy that is easily molded in a form of a thin film structure may be used without limitation. The metal member 10 may be formed by a molding method such as bending a metal thin film including the alloy or metal.

As such, as interposer substrates 300A1, 300A2, 300A3, 300B1, 300B2, and 300B3 of the present disclosure use the metal member 10 with high rigidity, it may be advantageous for warpage control compared to an interposer substrate according to a conventional build-up method. In addition, since the metal member 10 occupies a small area in a horizontal direction of an XY plane, and has a structure in which the area is mainly extended in a vertical direction of a Z-axis direction, it may be more advantageous in securing a mounting area, and an additional space may be secured.

The metal member 10 may perform a function of shielding components, for example, electronic components disposed in the internal space C of the metal member 10 from electromagnetic interference (EMI) and internal/external noise. To this end, the metal member 10 may be connected to a ground or an earth of the circuit board connected to an interposer board 300A1 to be described later, or may also be disposed to be spaced apart without being electrically connected to other components.

The electronic component that may be disposed in the internal space C may be an integrated circuit (IC) die in which several hundreds to several millions or more of elements are integrated into one chip. For example, the electronic component may be a processor chip (more specifically, an application processor (AP)) such as a central processor (for example, a CPU), a graphic processor (for example, a GPU), a field programmable gate array (FPGA), a digital signal processor, a cryptographic processor, a microprocessor, a microcontroller, or the like, but is not limited thereto. For example, the electronic component may also be a memory such as a volatile memory (for example, a DRAM), a non-volatile memory (for example, a ROM), a flash memory, or the like, or logic such as an analog-to-digital converter, an application-specific IC (ASIC), or the like. If necessary, the electronic component may be a passive component in the form of a chip, for example, an inductor in the form of a chip or a capacitor in the form of a chip.

The side surface of the metal member 10 described above functions as a shielding surface and may be referred to as a shielding surface hereinafter, and the metal member 10 may achieve an effect of shielding the components or configurations placed in the internal space C surrounded by the metal member 10 from EMI and internal/external noise.

On the other hand, the plurality of side surfaces 13 of the metal member 10 may include a first side surface 13-1 facing the internal space C and a second side surface 13 opposite to the first side surface 13-1. The first side surface 13-1 may function as an EMI shielding surface of the configuration disposed in the internal space C, and the second side surface 13-2 may function as an EMI shielding surface of a configuration disposed on an outer periphery of the metal member 10. Therefore, the second side surface 13-2 may function as a shielding surface that shields internal configurations of the connection substrates 100A and 100B to be described later when the connection substrates 100A and 100B are disposed on the second side surface 13-2.

Figure 4:
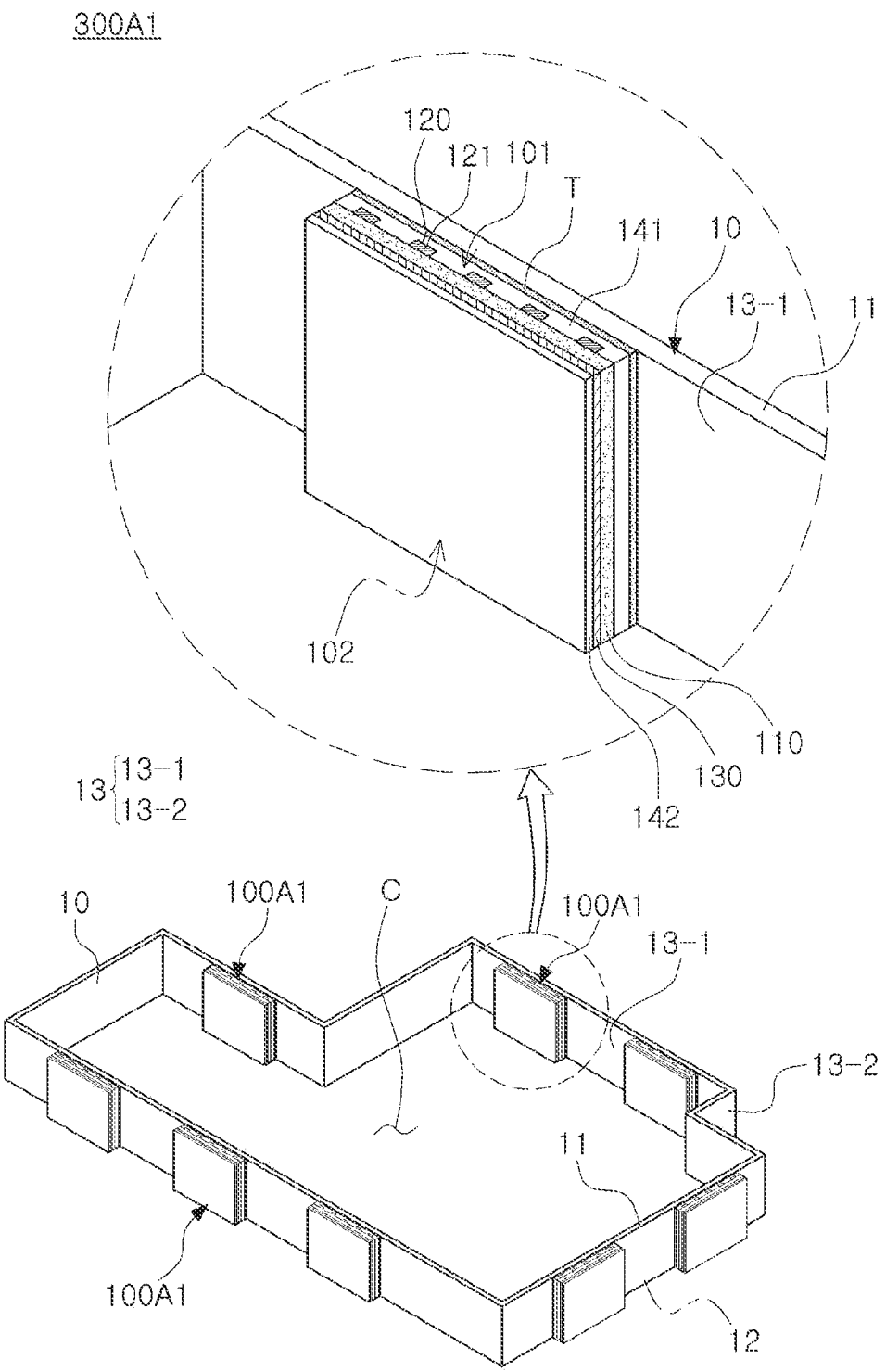
FIG. 4 is a schematic perspective view and a partially enlarged view of an interposer substrate and a connection substrate according to an example including the metal member of FIG. 3.

FIG. 4 is a schematic perspective view and a partially enlarged view of an interposer substrate and a connection substrate according to an example including the metal member of FIG. 3.

Referring to FIG. 4, a structure of an interposer substrate 300A1 according to an example including the metal member 10 of FIG. 3 is disclosed.

The interposer substrate 300A1 according to an example may include a metal member 10 and a connection substrate 100A1 disposed on at least portion of a side surface of the metal member 10, and the connection substrate 100A1 may include a circuit pattern 120 exposed from each of one surface 101 of the connection substrate 100A1 and the other surface 102 opposing the one surface.

Referring to FIG. 4, the connection substrate 100A1 according to an example may be disposed on at least partial region of the plurality of side surfaces 13 of the interposer substrate 300A1 according to an example, and a plurality of connection substrates 100A1 may be disposed to be spaced apart on a plurality of regions. At this time, the plurality of side surfaces 13 may include first and second side surfaces 13-1 and 13-2, and the connection substrate 100A1 may be disposed on a partial region of at least one of the first and second side surfaces 13-1 and 13-2.

Therefore, when the connection substrate 100A1 is disposed on the first side 13-1 of the metal member 10, the connection substrate 100A1 may be disposed in the internal space C, and when the connection substrate 100A1 is disposed on the second side 13-2 of the metal member 10, the connection substrate 100A1 may be disposed on the outside of the metal member 10 that is a space opposite to the internal space C based on the metal member 10.

In this way, since the connection substrate 100A1 capable of electrically connecting a plurality of components may be selectively disposed on the first and second side surfaces 13-1 and 13-2 of the metal member 10, the degree of design freedom of the interposer substrate 300A1 may be secured, and since the connection substrate 100A1 may be disposed only on a necessary region, production costs may be reduced to a minimum.

The connection substrate 100A1 disposed on the first and second side surfaces 13-1 and 13-2 of the interposer substrate 300A1 according to an example may have a structure in which at least a portion of the circuit pattern 120 is exposed from each of one surface 101 and the other surface 102.

In addition, one surface and the other surface 101 and 102 of the connection substrate 100A1 according to an example may be parallel to the first and second surfaces 11 and 12 of the metal member 10, respectively. However, the meaning of parallel here does not mean that they are parallel to each other without error, but also includes that they are arranged so as to be close to parallel to each other within a range including an approximate error.

In addition, the connection substrate 100A1 according to an example may have a plurality of side surfaces connecting one surface and the other surface, as described later. In this case, at least one of the plurality of side surfaces of the connection substrate 100A1 according to an example may be orthogonal to each of one surface and the other surface of the connection substrate. Here, the meaning of orthogonal does not necessarily mean that both thereof are orthogonal without error, but also includes that both are arranged so as to be close to orthogonal within a range including an approximate error.

Therefore, as illustrated, one surface 101 and the other surface 102 of the connection substrate 100A1 according to an example may be disposed on the side surface of the metal member 10 to be perpendicular to the side surface 13 of the metal member 10, and by exposing the circuit pattern 120 toward the outside of the connection substrate 100A1, the circuit pattern 120 may electrically connect components disposed on the first and second surfaces 11 and 12 of the metal member 10.

For example, a main board may be disposed under the interposer substrate 300A1, and a multilayer printed circuit board may be disposed on the interposer substrate 300A1. In this case, the circuit pattern 120 exposed to one surface 101 and the other surface 102 of the connection board 100A1 is connected to the multilayer printed circuit board and the main board, respectively, and may be a path for electrically connecting both.

Unlike a conventional interposer substrate having a stacked structure built up in multiple layers, since the interposer substrate 300A1 according to the present disclosure has a structure including the connection substrate 100A1 disposed on a bent metal member 10 as illustrated in FIG. 4, the effect of significantly reducing the mounting area of the interposer substrate 300A1 may be achieved.

In addition, in the case of the interposer substrate having the built-up stacked structure, a warpage phenomenon of the substrate may occur due to a cause such as a difference in coefficient of thermal expansion between materials to be built up. However, since the interposer substrate 300A1 according to an example of the present disclosure does not have the stacked structure, and a single metal member 10 is configured to have a closed loop shape or a stripe shape, the warpage phenomenon may be controlled.

Hereinafter, the configuration of the connection substrate 100A1 according to an example included in the interposer substrate 300A1 according to an example will be described in more detail.

Figure 5:
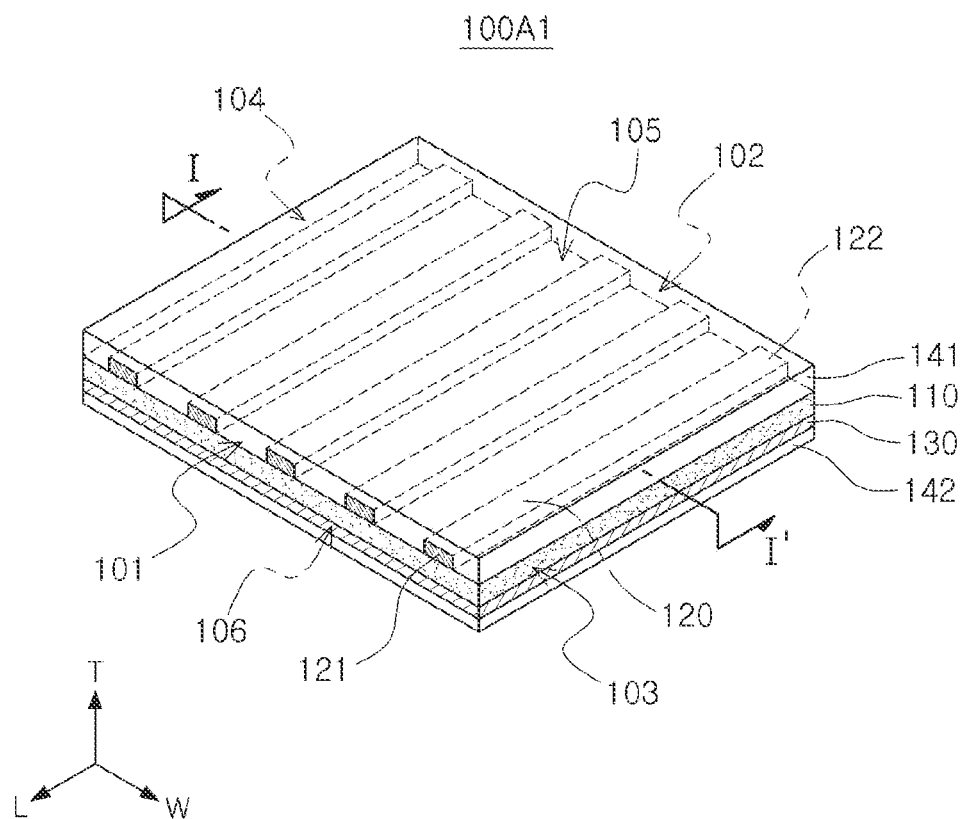
FIG. 5 is a schematic perspective view illustrating a connection substrate included in the interposer substrate of FIG. 4.
Figure 6:
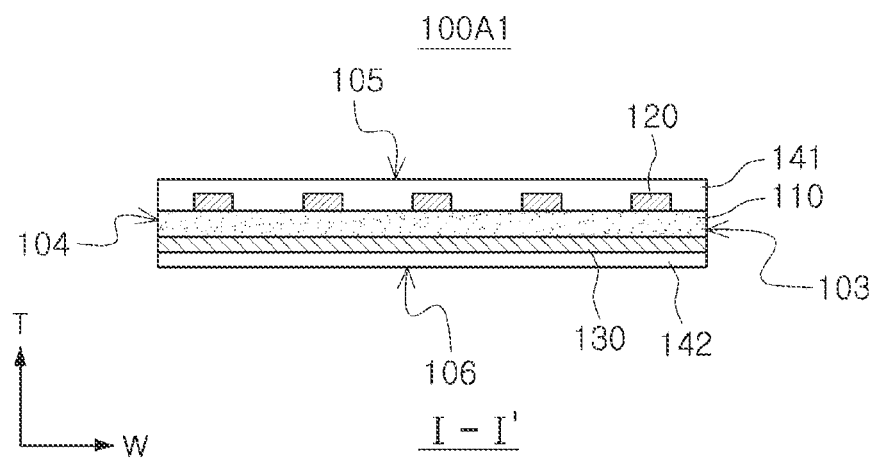
FIG. 6 is a cutaway plan view of the connection substrate of FIG. 5 taken along line I-I'.

FIG. 5 is a schematic perspective view illustrating a connection substrate included in the interposer substrate of FIG. 4, and FIG. 6 is a cutaway plan view of the connection substrate of FIG. 5 taken along line I-I'.

The connection substrate 100A1 according to an example may include a first surface 101 and a second surface 102 opposing each other in a length direction L of the connection substrate 100A1, a third surface 103 and a fourth surface 104 opposing each other in a width direction W of the connection substrate 100A1, and a fifth surface 105 and a sixth surface 106 opposing each other in a thickness direction T or a stacked direction T of the connection substrate 100A1. The first and second surfaces 101 and 102 may be connected to each other by the third to sixth surfaces 103, 104, 105, and 106.

The first and second surfaces 101 and 102 of the connection substrate 100A1 according to the example above refer to the same surfaces as the one and the other surfaces 101 and 102 described above.

The perspective view of FIG. 5 discloses a structure in which the connection substrate 100A1 according to an example is obliquely disposed at an angle of 90° compared to the structure disposed in FIG. 4. That is, an arrangement structure in a horizontal cross section in the perspective view of FIG. 5 may correspond to an arrangement structure in a vertical cross section in the perspective view of FIG. 4.

The connection substrate 100A1 according to an example may include a core layer 110, a circuit pattern 120 disposed on one surface of the core layer 110, a ground pattern 130 disposed on the other surface of the core layer 110, a first protective layer 141 disposed on one surface of the core layer 110 to cover the circuit pattern 120, and a second protective layer 142 disposed on the ground pattern 130 on the other surface of the core layer 110.

The core layer 110 may function as a core of the connection substrate 100A1 according to an example, and may perform a function of supporting the circuit pattern 120 and the ground pattern 130 disposed on one surface and the other surface and insulating the circuit pattern 120 and the ground pattern 130. A thickness of the core layer 110 may be thicker than that of each of the circuit pattern 120 and the ground pattern 130 to maintain rigidity and control warpage, but is not limited thereto.

An insulating material may be used as a material of the core layer 110, and a thermosetting resin such as an epoxy resin or a thermoplastic resin such as polyimide may be used as the insulating material. In addition, a material containing inorganic filler such as silica and a reinforcing material such as glass fiber in these resins may be used. The material of the core layer 110 may be prepreg, but is not limited thereto. Alternatively, the core layer 110 may also be manufactured in the form of resin coated copper (RCC) or copper clad laminate (CCL). When the core layer 110 is provided in the form of a copper clad laminate (CCL), the connection substrate 100A1 may have a structure in which thin copper foils are disposed on both sides of the core layer 110, and the thin copper foils may function as a seed layer when forming the circuit pattern 120 and the ground pattern 130 later.

The circuit pattern 120 may be disposed on one surface of the core layer 110 and may have a shape extending along one direction. Referring to FIG. 5, the circuit pattern 120 may have a shape disposed to extend along the length direction L on one surface of the core layer 110. That is, the circuit pattern 120 may have a shape extending from the first surface 101 that is one surface of the connection substrate 100A1 to the second surface 102 that is the other surface. In addition, a plurality of circuit patterns 120 may be formed, and each of the plurality of circuit patterns 120 may be disposed to be spaced apart from each other in the width direction W.

Meanwhile, the circuit pattern 120 may be disposed to be exposed to the outside from the first and second surfaces 101 and 102 of the connection substrate 100A1 according to an example. That is, an end surface 121 of the circuit pattern 120 may be exposed in at least a partial region on the first surface 101 of the connection substrate 100A1, and an end surface 122 of the circuit pattern 120 may be exposed in at least a partial region on the second surface 102 of the connection substrate 100A1.

In this way, as the end surfaces 121 and 122 of the circuit pattern 120 are exposed to the first and second surfaces 101 and 102 of the connection substrate 100A1 according to an example, the circuit pattern 120 may be a path for electrically connecting the components disposed on the first and second surfaces 101 and 102 of the connection substrate 100A1.

Meanwhile, the regions 121 and 122 of the circuit pattern 120 exposed from the connection substrate 100A1 may form coplanar with the first and second surfaces 101 and 102 of the connection substrate 100A1, respectively.

Here, the forming of coplanar may mean that the exposed end surface 121 of the circuit pattern 120 and the first surface 101 of the connection substrate 100A1 are horizontal across each of the exposed end surface 121 and the first surface 101, or have a structure in which upper surfaces of both are arranged to be connected to each other continuously even if the exposed end surface 121 and the first surface 101 are not horizontal or a similar structure.

In addition, the forming of coplanar may mean that the exposed end surface 122 and the second surface 102 of the connection substrate 100A1 are horizontal across each of the exposed end surface 122 and the second surface 102, or have a structure in which upper surfaces of both are arranged to be connected to each other continuously even if the exposed end surface 122 and the second surface 102 are not horizontal or a similar structure.

On the other hand, in the case of the conventional interposer substrate, after lamination, a multilayer insulating layer is processed to form a via, and then an electrical connection path is secured through a plating process, but in the case of the interposer substrate 300A1 according to an example, an electrical connection path may be secured only by a patterning process of the circuit pattern 120 without a separate via processing process, and thus a via processing process such as laser processing may be omitted. Therefore, effects such as improved productivity and reduced manufacturing cost may be achieved.

In addition, the circuit pattern 120 of the present disclosure may be formed by performing a photolithography process using a photoresist, and thus a cross-sectional area of the circuit pattern 120 in the length direction L may be relatively constant. Therefore, in the circuit pattern 120 of the present disclosure, the problem of insufficiently secured reliability or defective plating and connection that may occur in a narrow area because a width of the via formed by the laser processing process is not constant during the via processing process may be prevented.

A metal material may be used as the material of the circuit pattern 120. As the metal material, copper (Cu), aluminum (Al), silver (Ag), tin (Sn), gold (Au), nickel (Ni), lead (Pb), titanium (Ti), or alloys thereof may be used. The circuit pattern 120 may perform various functions depending on a design. For example, the circuit pattern 120 may include ground patterns, power patterns, signal patterns, and the like. Each of these patterns may be in the form of a line, a plane, or a pad. The circuit pattern 120 may be formed by a plating process such as an additive process (AP), a semi AP (SAP), a modified SAP (MSAP), or a tenting (TT), respectively, and may thus each include a seed layer, which is an electroless plating layer, and an electrolytic plating layer formed based on the seed layer. When the first protective layer 141 is provided in the form of an RCC, the circuit pattern 120 may further include a metal foil such as copper foil, and if necessary, a primer resin may be present on a surface of the metal foil.

Alternatively, when a copper clad laminate (CCL) is used as the core layer 110, the copper foil layer itself disposed on one surface of the copper clad laminate (CCL) may be patterned and used as the circuit pattern 120. In this case, the circuit pattern 120 may not include a separate seed layer.

The ground pattern 130 may be disposed on the other surface of the core layer 110, may be disposed over the entire other surface of the core layer 110, and may be disposed only in a partial region through partial etching. In the connection substrate 100A1 according to the example of FIG. 5, the ground pattern 130 may be exposed on the first and second surfaces 101 and 102 of the connection substrate 100A1 according to the example. In addition, the ground pattern 130 may also be exposed on the third and fourth surfaces 103 and 104 of the connection substrate 100A1 opposing in the width direction W, respectively.

As the ground pattern 130 is disposed on the other surface of the core layer 110, the circuit pattern 120 and the ground pattern 130 may be disposed to be spaced apart by the thickness of the core layer 110 when viewed from the thickness direction T of the connection substrate 100A1 according to an example. In this way, the ground pattern 130 may be spaced apart from the circuit pattern 120 to perform a function of shielding the circuit pattern 120 from external noise. Therefore, the remaining surfaces except for the surfaces of the ground pattern 130 in contact with the core layer 110 and the second protective layer 142 may be exposed to the outside of the connection substrate 100A1.

That is, the ground pattern 130 may have end surfaces 131 and 132 that are exposed on the first and second surfaces 101 and 102 of the connection substrate 100A1 according to an example, and may also have end surfaces 133 and 134 that are exposed on the third and fourth surfaces 103 and 104 thereof.

However, the ground pattern 130 is not limited to the above-mentioned structure, and may also be exposed only to at least a portion of the first to fourth surfaces 101, 102, 103, and 104 of the connection substrate 100A1, and may also not be exposed to the other surfaces.

The ground pattern 130 may perform a function of shielding the circuit pattern 120 in the connection substrate 100A1 and the configuration disposed in the internal space C. As the ground pattern 130 is disposed in the form of a plane including a metal material, configurations such as electronic components disposed in the internal space C may be shielded from EMI and internal/external noise.

Therefore, the configuration disposed in the internal space C of the metal member 10 may obtain an effect of shielding EMI by each of the metal member 10 and the ground pattern 130, and accordingly, a structure of the interposer substrate 300A1 having a double shielding layer is disclosed.

Meanwhile, as the circuit pattern 120 is disposed between the metal member 10 disposed on one side and the ground pattern 130 disposed on the other side opposing one side, the circuit pattern 120 may obtain EMI and internal/external noise shielding effects in both directions, and thus a shielding effect may be improved compared to a configuration in which a shield layer is disposed only on one side.

The ground pattern 130 may be connected to an earth or a ground among the configurations to be disposed later on/under the interposer substrate 300A1.

A metal material may be used as the material of the ground pattern 130. As the metal material, copper (Cu), aluminum (Al), silver (Ag), tin (Sn), gold (Au), nickel (Ni), lead (Pb), titanium (Ti), or alloys thereof may be used. The ground pattern 130 may perform various functions depending on a design. The ground pattern 130 may be in the form of a line, a plane, or a pad. The ground pattern 130 may be formed by a plating process such as an additive process (AP), a semi AP (SAP), a modified SAP (MSAP), or a tenting (TT), respectively, and may thus each include a seed layer, which is an electroless plating layer, and an electrolytic plating layer formed based on the seed layer. When the core layer 110 is provided in the form of an RCC, the ground pattern 130 may further include a metal foil such as copper foil, and if necessary, a primer resin may be present on a surface of the metal foil.

Alternatively, when a copper clad laminate (CCL) is used as the core layer 110, the copper foil layer itself disposed on the other surface of the copper clad laminate (CCL) may also be used as the ground pattern 130. In this case, the ground pattern 130 may not include a separate seed layer.

The first and second protective layers 141 and 142 are functions to protect the circuit pattern 120 and the ground pattern 130, respectively, and may also perform a function of insulating the circuit pattern 120 and the ground pattern 130 from the external configuration. Internal components may be protected from physical and chemical damage through the first and second protective layers 141 and 142.

The first protective layer 141 may be disposed on one surface of the core layer 110 to cover the circuit pattern 120. When a plurality of circuit patterns 120 are disposed to be spaced apart, the first protective layer 141 may also protect between the spaced circuit patterns 120 as illustrated in FIGS. 5 and 6. A surface opposite to the surface of the first protective layer 141 in contact with the circuit pattern 120 may be attached to the metal member 10.

The first protective layer 141 may cover the side surface of the circuit pattern 120 in the width direction W, but may not cover the side surface of the circuit pattern 120 in the length direction L. As a result, as illustrated in FIG. 5, the end surfaces 121 and 122 of the circuit pattern 120 may be exposed to the first and second surfaces 101 and 102, which are the side surfaces of the connection substrate 100A1 according to an example in the length direction L, respectively, and as illustrated in FIG. 6, the side surface of the circuit pattern 120 in the width direction W may be covered by the first protective layer 141 and may not be exposed to the outside.

Meanwhile, referring to FIG. 4, in order to attach the connection substrate 100A1 according to an example, an adhesive layer T may be disposed between the first protective layer 141 and the side surface 13 of the metal member 10. The adhesive layer T may perform a function of fixing the first protective layer 141 and the metal member 10 in preparation for insufficient adhesion between the first protective layer 141 including different materials and the metal member 10.

On the other hand, the first protective layer 141 may be in contact with the side surface 13 of the metal member 10 without a separate adhesive layer, and the connection substrate 100A1 according to an example may also be disposed at least partially of the side surface 13 of the metal member 10. In this case, before the connection substrate 100A1 is attached to the side surface 13 of the metal member 10, the first protective layer 141 may be in a semi-cured or partially cured state, and the connection substrate 100A1 according to an example may be bonded onto the side surface 13 of the metal member 10 through the first protective layer 141 in the semi-cured or partially cured state. When the first protective layer 141 is cured through a curing process after the connection substrate 100A1 is bonded, the connection substrate 100A1 may be fixed. As a result, the configuration of the adhesive layer T may be omitted unlike FIG. 4.

An insulating material may be used as a material of the first protective layer 141, and a thermosetting resin such as an epoxy resin or a thermoplastic resin such as polyimide may be used as the insulating material. In addition, a material containing inorganic filler such as silica in these resins may be used. For example, a prepreg may be used as the material of the first protective layer 141, and a photosensitive material such as photo image-able dielectric (PID) may be used if necessary.

Meanwhile, the first protective layer 141 may include an organic insulating material capable of being semi-cured or partially cured. For example, the first protective layer 141 may include at least one of Ajinomoto Build-up Film (ABF) and polyimide, but is not limited thereto. ABF may be provided in the form of resin coated copper (RCC), but is not limited thereto.

The second protective layer 142 may be disposed on the other surface of the core layer 110 and may be disposed on the ground pattern 130 to cover the ground pattern 130. The second protective layer 142 may protect the ground pattern 130 from physical and chemical damage. The second protective layer 142 may be disposed to expose the ground pattern 130 to the first and second surfaces 101 and 102 of the connection substrate 100A1 as illustrated in FIGS. 5 and 6, and may expose the ground pattern 130 to the third and fourth surfaces 103 and 104 of the connection substrate 100A1 as illustrated in FIG. 6.

An insulating material may be used as a material of the second protective layer 142, and a thermosetting resin such as an epoxy resin or a thermoplastic resin such as polyimide may be used as the insulating material. In addition, a material containing inorganic filler such as silica in these resins may be used. For example, a prepreg may be used as the material of the second protective layer 142, and a photosensitive material such as PID may be used if necessary.

Other contents are substantially the same as described above, and overlapping contents will be omitted.

Figure 7:
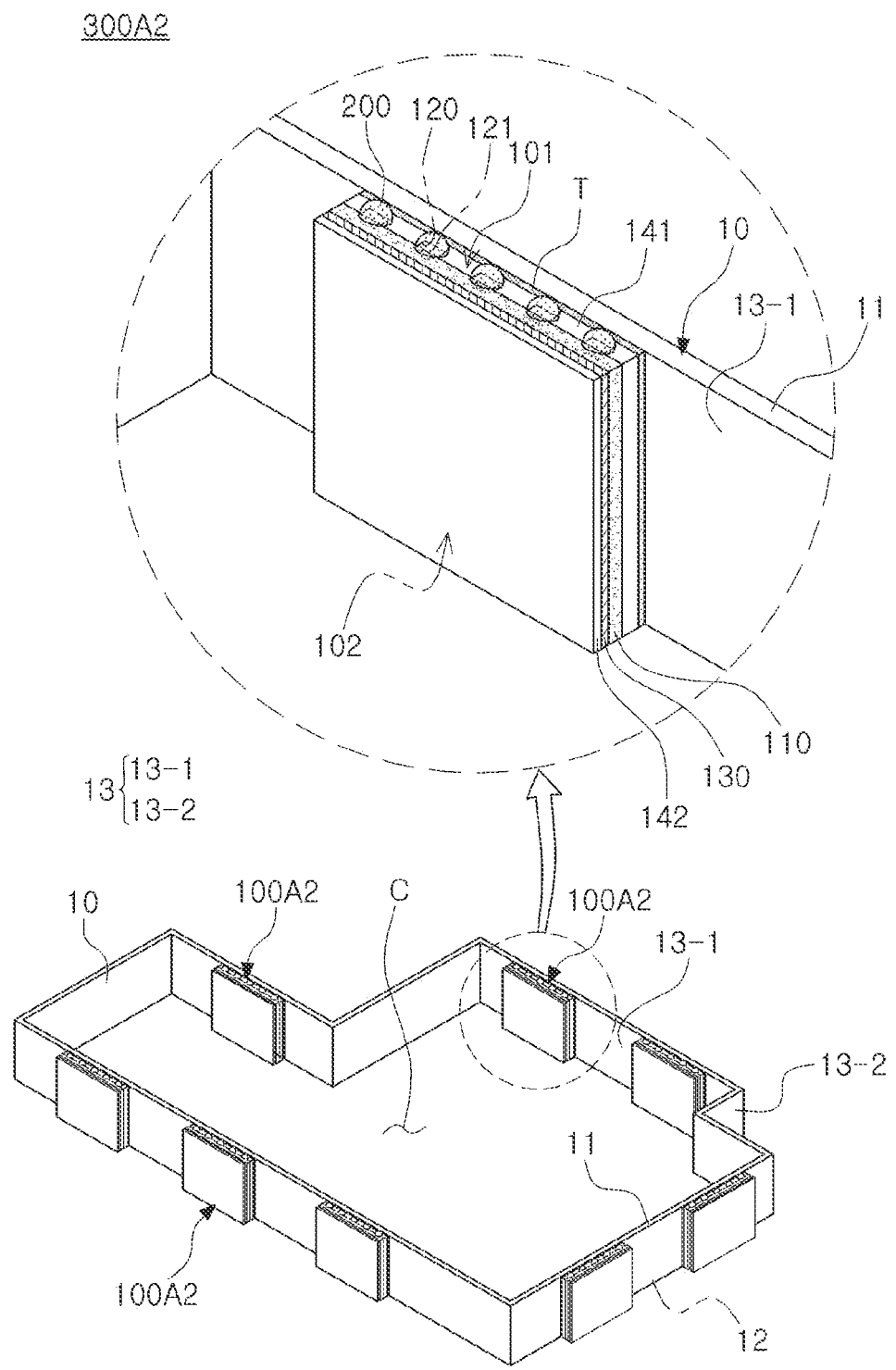
FIG. 7 is a schematic perspective view illustrating a modified example of the connection substrate of FIG. 5.

FIG. 7 is a schematic perspective view illustrating a modified example of the connection substrate of FIG. 5.

In a connection substrate 100A2 according to a modified example of FIG. 7, an electrical connection metal 200 may be further disposed compared to the connection substrate 100A1 according to the example. Accordingly, with respect to other overlapping configurations, the description of the connection substrate 100A1 according to the example described above may be equally applied.

According to the connection substrate 100A2 according to the modified example, the electrical connection metal 200 may be further disposed on the connection substrate. Referring to FIG. 7, the electrical connection metal 200 may be disposed on the first and second surfaces 101 and 102 of the connection substrate 100A2, respectively, to cover the end surfaces 121 and 122 of the circuit pattern 120 exposed to the first and second surfaces 101 and 102.

Specifically, a plurality of electrical connection metals 200 may be disposed, and may be disposed on a plurality of exposed end surfaces 121 and 122, respectively, when a plurality of end surfaces 121 and 122 of the circuit pattern 120 are exposed to the first and second surfaces 101 and 102.

Through the electrical connection metal 200, the circuit pattern 120 and the external configuration may be electrically connected, and the circuit pattern 120 may serve as a passage for electrically connecting a configuration disposed on the first surface 101 of the connection substrate 100A2 and a configuration disposed on the second surface 102 thereof.

The electrical connection metal 200 may be formed of tin (Sn) or an alloy containing tin (Sn), for example, solder, but is not limited thereto. The electrical connection metal 200 may be a land, a ball, a pin, or the like.

Although not illustrated, the interposer substrate 300A2 according to the modified example may have a structure in which the connection substrate 100A2 according to the modified example is attached to the metal member 10 instead of the connection substrate 100A1 according to an example, and for the description of other configurations, the description of the interposer substrate 300A1 according to an example may be equally applied.

Other contents are substantially the same as described above, and overlapping contents will be omitted.

Figure 8:
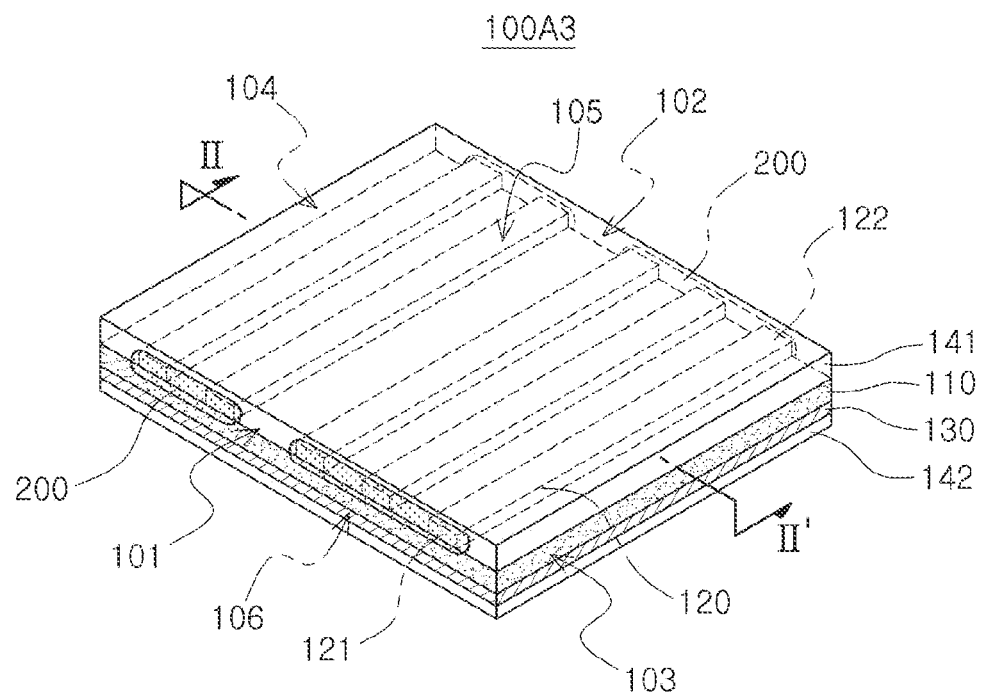
FIG. 8 is a schematic perspective view illustrating another modified example of the connection substrate of FIG. 5.
Figure 9:
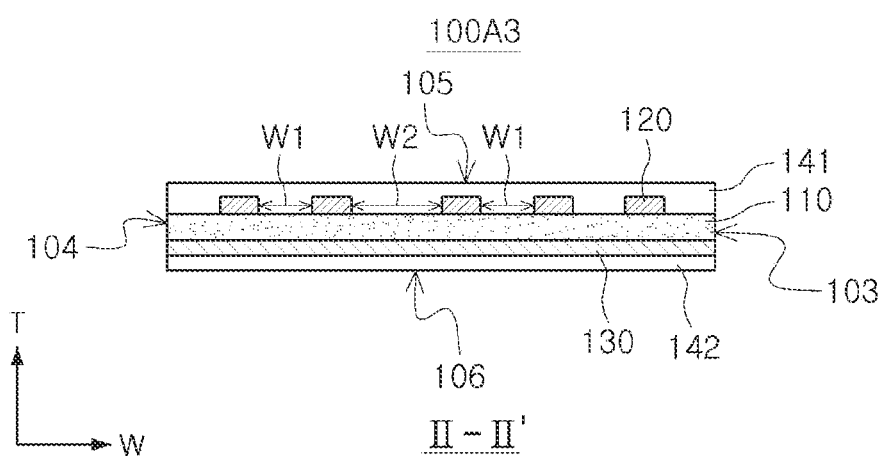
FIG. 9 is a cutaway plan view taken along line II-II' in another modified example of the connection substrate of FIG. 8.

FIG. 8 is a schematic perspective view illustrating another modified example of the connection substrate of FIG. 5, and FIG. 9 is a cutaway plan view taken along line II-II' in another modified example of the connection substrate FIG. 8.

A connection substrate 100A3 according to another modified example of FIG. 8 has a different arrangement structure of the electrical connection metal 200 compared to the connection substrate 100A2 according to the modified example. Accordingly, with respect to other overlapping configurations, the description of the connection substrate 100A2 according to the modified example described above may be equally applied.

Referring to FIG. 8, in the case of the connection substrate 100A3 according to another modified example, the electrical connection metal 200 may be disposed on a plurality of end surfaces where the circuit pattern 120 is exposed.

Specifically, as illustrated in FIG. 8, one electrical connection metal 200 may be disposed on the first surface 101 of the connection substrate 100A3 while covering a plurality of end surfaces 121 to electrically connect the end surfaces 121 of the plurality of circuit patterns 120. In FIG. 8, a plurality of electrical connection metals 200 are disposed to cover the end surfaces 121 of two and three circuit patterns 120, respectively, but this is only an example.

Meanwhile, although not illustrated, the electrical connection metal 200 may also be disposed on the second surface 102 of the connection substrate 100A3, and likewise in this case, one electrical connection metal 200 may be disposed while covering a plurality of end surfaces 122 to electrically connect the end surfaces 122 of the plurality of circuit patterns 120.

According to such a structure, a plurality of adjacent circuit patterns 120 may be electrically connected through a single electrical connection metal 200, so that a signal transmission distance may be shortened and a more diverse design is possible. For example, by connecting a plurality of adjacent circuit patterns 120 transmitting the same signal with a single electrical connection metal 200, resistance during signal transmission may be reduced. By using a plurality of circuit patterns 120 as a transmission path for the same signal, when a problem such as a defect occurs in one circuit pattern 120, signal transmission is possible through another circuit pattern 120 connected through the same electrical connection metal 200, and thus the reliability and stability of signal transmission may be improved.

FIG. 9 illustrates a cutaway plan view of the connection substrate 100A3 according to another modified example of FIG. 8 taken along line II-II'. When the plurality of adjacent circuit patterns 120 are connected by the single electrical connection metal 200 as illustrated in FIG. 8, a separation distance between the circuit patterns 120 connected by the same electrical connection metal 200 may be shorter than a separation distance between the circuit patterns 120 connected to different electrical connection metals 200.

Therefore, a separation distance W1 illustrated in FIG. 9 may be shorter than a separation distance W2. By such a structure, a separation distance between paths for transmitting the same signal may be short, and a separation distance between paths for transmitting different signals may be large, so that noise generation between the paths for transmitting different signals may be relatively reduced. Meanwhile, although not limited thereto, even when the plurality of adjacent circuit patterns 120 are connected by the single electrical connection metal 200 as illustrated in FIG. 8, all of the separation distances between the respective circuit patterns 120 may be the same.

Although not illustrated, the interposer substrate 300A3 according to the modified example may have a structure in which the connection substrate 100A3 according to another modified example is attached to the metal member 10 instead of the connection substrate 100A1 according to an example, and for the description of other configurations, the description of the interposer substrate 300A1 according to an example may be equally applied.

Other contents are substantially the same as described above, and overlapping contents will be omitted.

Figure 10:
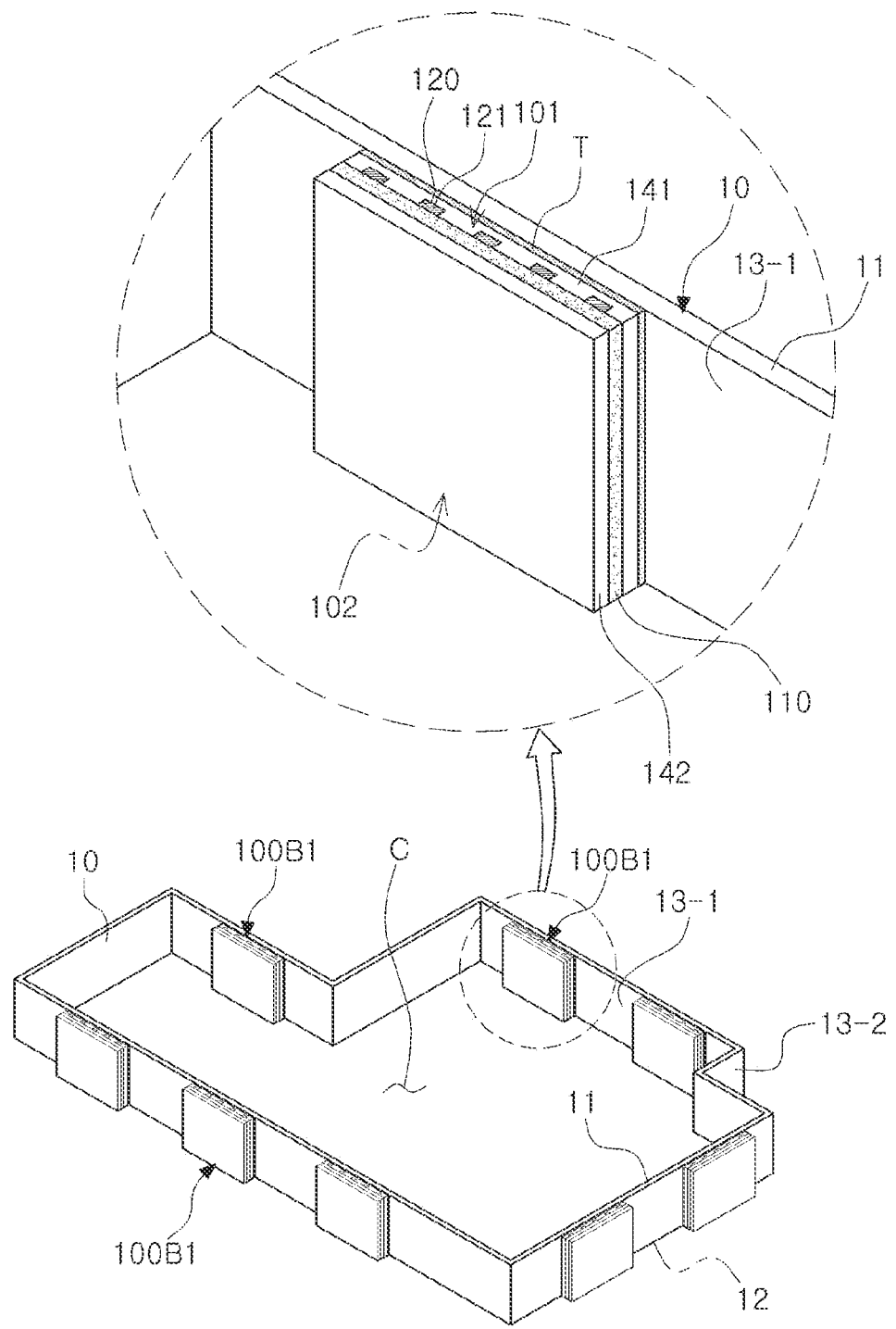
FIG. 10 is a schematic perspective view and a partially enlarged view of an interposer substrate and a connection substrate according to another example including the metal member of FIG. 3.

FIG. 10 is a schematic perspective view and a partially enlarged view of an interposer substrate and a connection substrate according to another example including the metal member of FIG. 3.

An interposer substrate 300B1 according to another example of FIG. 10 has a different arrangement structure of the connection substrate as compared to the interposer substrate 300A1 according to an example. Accordingly, with respect to other overlapping configurations, the description of the interposer substrate 300A1 according to the example described above may be equally applied.

Referring to FIG. 10, a structure of an interposer substrate 300B1 according to another example having a different arrangement structure of the connection substrate as compared to the interposer substrate 300A1 according to an example is disclosed.

In the interposer substrate 300B1 according to another example, as in the example, the plurality of side surfaces 13 of the metal member 10 may include a first side surface 13-1 and a second side surface 13-2, and a connection substrate 100B1 according to another example may be attached to a partial region of at least one of the first and second side surfaces 13-1 and 13-2. The connection substrate 100B1 according to another example has a different arrangement relationship between the ground pattern 130 and the second protective layer 142 as compared to the connection substrate 100A1 according to the example. This will be described later.

In the case of the interposer substrate 300B1 according to another example, the description of the interposer substrate 300A1 according to the example may be equally applied except that the connection substrate 100B1 according to another example is disposed instead of the connection substrate 100A1 according to an example.

Other contents are substantially the same as described above, and overlapping contents will be omitted.

Figure 11:
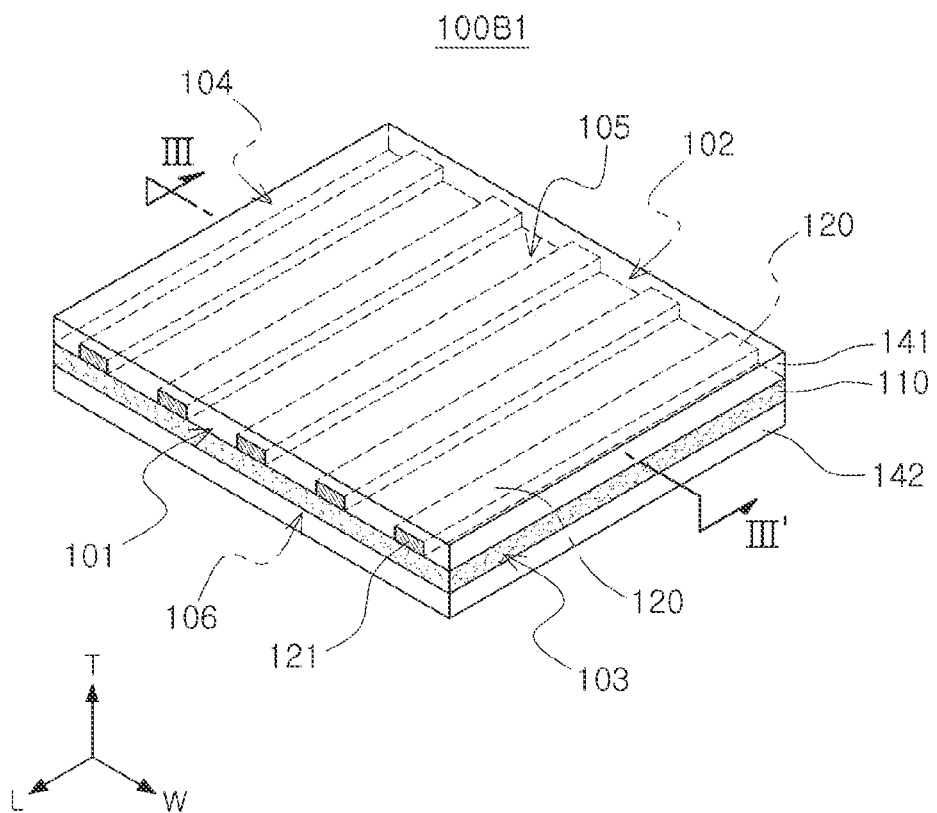
FIG. 11 is a schematic perspective view illustrating a connection substrate included in the interposer substrate of FIG. 10.
Figure 12:
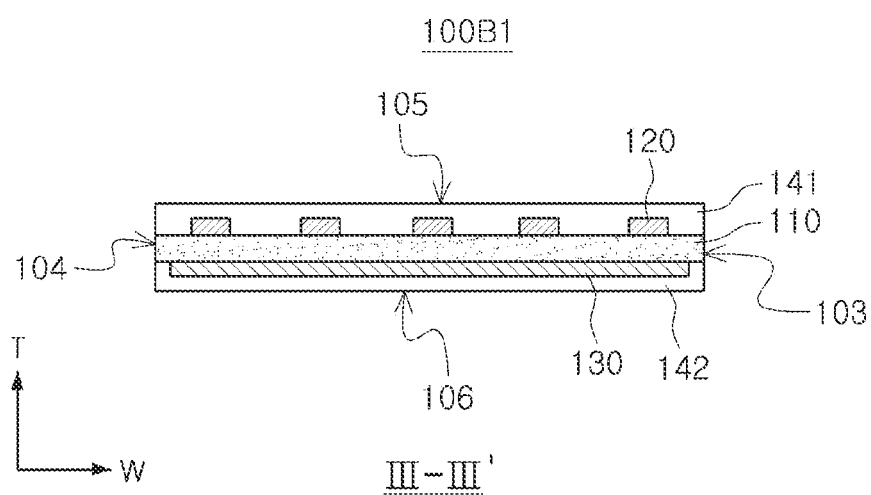
FIG. 12 is a cutaway plan view of the connection substrate of FIG. 11 taken along line III-III'.

FIG. 11 is a schematic perspective view illustrating a connection substrate included in the interposer substrate of FIG. 10, and FIG. 12 is a cutaway plan view of the connection substrate of FIG. 11 taken along line III-III'.

Referring to FIG. 11, the connection substrate 100B1 according to another example has a different arrangement relationship between the ground pattern 130 and the second protective layer 142 as compared to the connection substrate 100A1 according to the example. Accordingly, with respect to other overlapping configurations, the description of the connection substrate 100A1 according to the example may be equally applied.

In the connection substrate 100B1 according to another example of FIG. 11, the ground pattern 130 disposed on the other surface of the core layer 110 may not be exposed to a side surface of the connection substrate 100B1 in the width direction W or the length direction L. That is, a structure in which the ground pattern 130 is not exposed to the third to sixth surfaces of the connection substrate 100B1 and is completely buried by the core layer 110 and the second protective layer 142 is disclosed. Therefore, the second protective layer 142 may cover the remaining surfaces of the outer surfaces of the ground pattern 130 except for a surface in contact with the other surface of the core layer 110.

Referring to FIG. 12, the ground pattern 130 may not be exposed to both sides of the connection substrate 100B1 in the width direction W, and both side surfaces of the ground pattern 130 in the width direction W may be in contact with the second protective layer 142 and may be covered by the second protective layer 142. This is also the same on both sides of the ground pattern 130 in the length direction L.

As described above, due to the second protective layer 142 covering the ground pattern 130 in the structure of the connection substrate 100B1 according to another example, when the electrical connection metal 200 is later disposed on the end surfaces 121 and 122 of the circuit pattern 120, a problem in which the electrical connection metal 200 flows to the ground pattern 130 and causes a short circuit between the circuit pattern 120 and the ground pattern 130 may be prevented in advance. The structure of the connection substrate 100B1 according to another example may be more effectively utilized when the separation distance between the circuit pattern 120 and the ground pattern 130 is close because the core layer 110 is relatively thin.

As described above, since the connection substrate 100B1 according to another example may prevent the short circuit problem between the circuit pattern 120 and the ground pattern 130, the core layer 110 may be relatively thin. Accordingly, the overall thickness of the connection substrate 100B1 may be reduced, and the overall component may be miniaturized.

Other contents are substantially the same as described above, and overlapping contents will be omitted.

Figure 13:
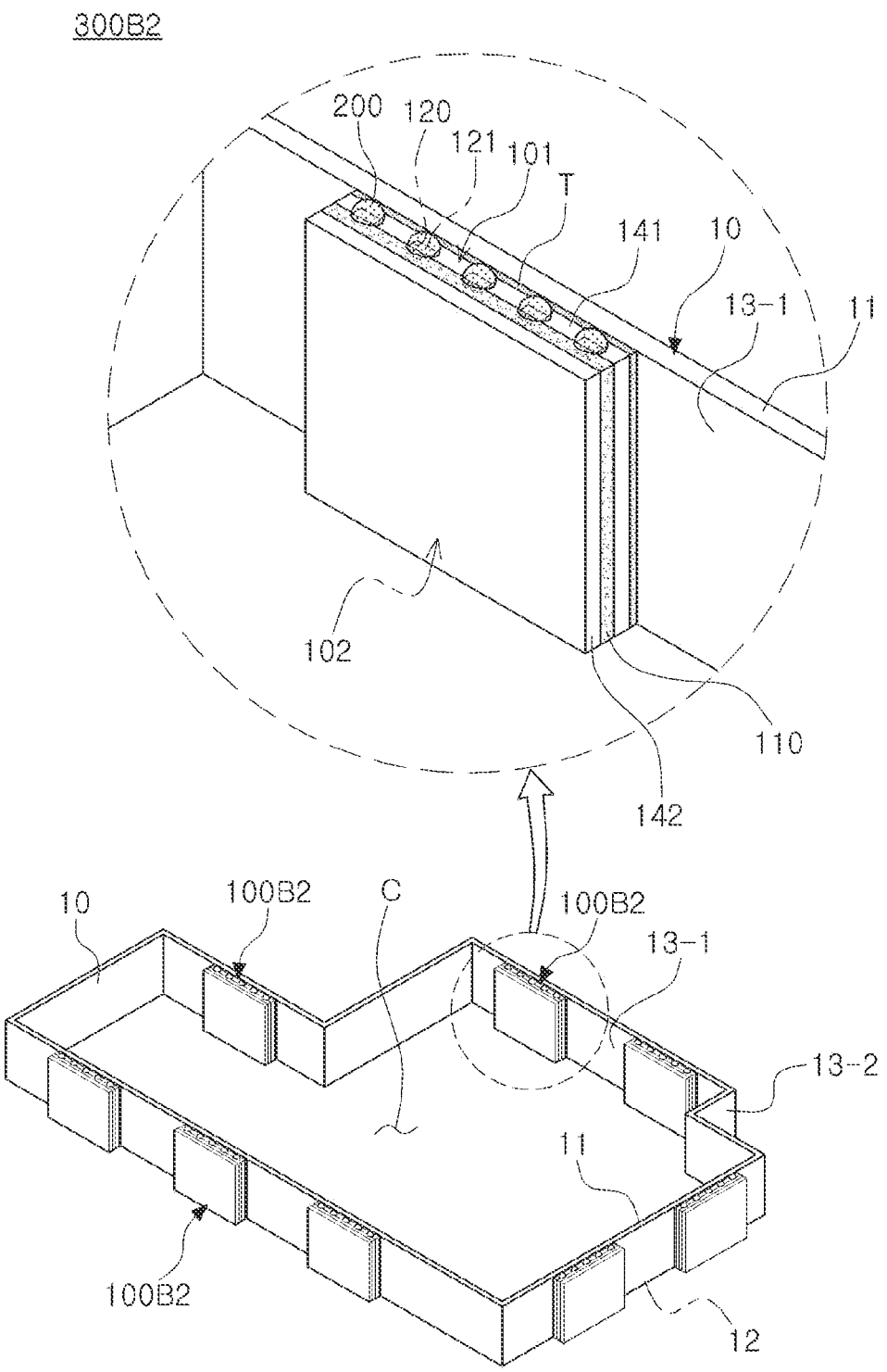
FIG. 13 is a schematic perspective view illustrating a modified example of the connection substrate of FIG. 11.

FIG. 13 is a schematic perspective view illustrating a modified example of the connection substrate of FIG. 11.

In a connection substrate 100B2 according to a modified example of FIG. 13, an electrical connection metal 200 may be further disposed compared to the connection substrate 100B1 according to another example. Accordingly, with respect to other overlapping configurations, the description of the interposer substrate 100B1 according to the example described above may be equally applied.

According to the connection substrate 100B2 according to the modified example, the electrical connection metal 200 may be further disposed on the connection substrate. Referring to FIG. 13, the electrical connection metal 200 may be disposed on the first and second surfaces 101 and 102 of the connection substrate 100B2, respectively, to cover the end surfaces 121 and 122 of the circuit pattern 120 exposed to the first and second surfaces 101 and 102.

Specifically, a plurality of electrical connection metals 200 may be disposed, and may be disposed on a plurality of exposed end surfaces 121 and 122, respectively, when a plurality of end surfaces 121 and 122 of the circuit pattern 120 are exposed to the first and second surfaces 101 and 102.

Through the electrical connection metal 200, the circuit pattern 120 and the external configuration may be electrically connected, and the circuit pattern 120 may serve as a passage for electrically connecting a configuration disposed on the first surface 101 of the connection substrate 100B2 and a configuration disposed on the second surface 102 thereof.

That is, in the connection substrate 100B2 according to the modified example, as in the connection substrate 100B1 according to another example described above, a structure in which the ground pattern 130 is completely buried by the core layer 110 and the second protective layer 142 is disclosed. Therefore, the electrical connection metal 200 may be disposed not only on the circuit pattern 120 but also on the ground pattern 130 to prevent defects such as a short circuit between the circuit pattern 120 and the ground pattern 130.

In addition, compared to the connection substrate 100A2 according to the modified example, since the short circuit problem may be prevented, the core layer 110 may be relatively thin. Accordingly, the overall thickness of the connection substrate 100B2 may be reduced, and the overall component may be miniaturized.

The electrical connection metal 200 may be formed of tin (Sn) or an alloy containing tin (Sn), for example, solder, but is not limited thereto. The electrical connection metal 200 may be a land, a ball, a pin, or the like.

Although not illustrated, the interposer substrate 300B2 according to the modified example may have a structure in which the connection substrate 100B2 according to the modified example is attached to the metal member 10 instead of the connection substrate 100B1 according to another example, and for the description of other configurations, the description of the interposer substrate 300B1 according to another example may be equally applied.

Other contents are substantially the same as described above, and overlapping contents will be omitted.

Figure 14:
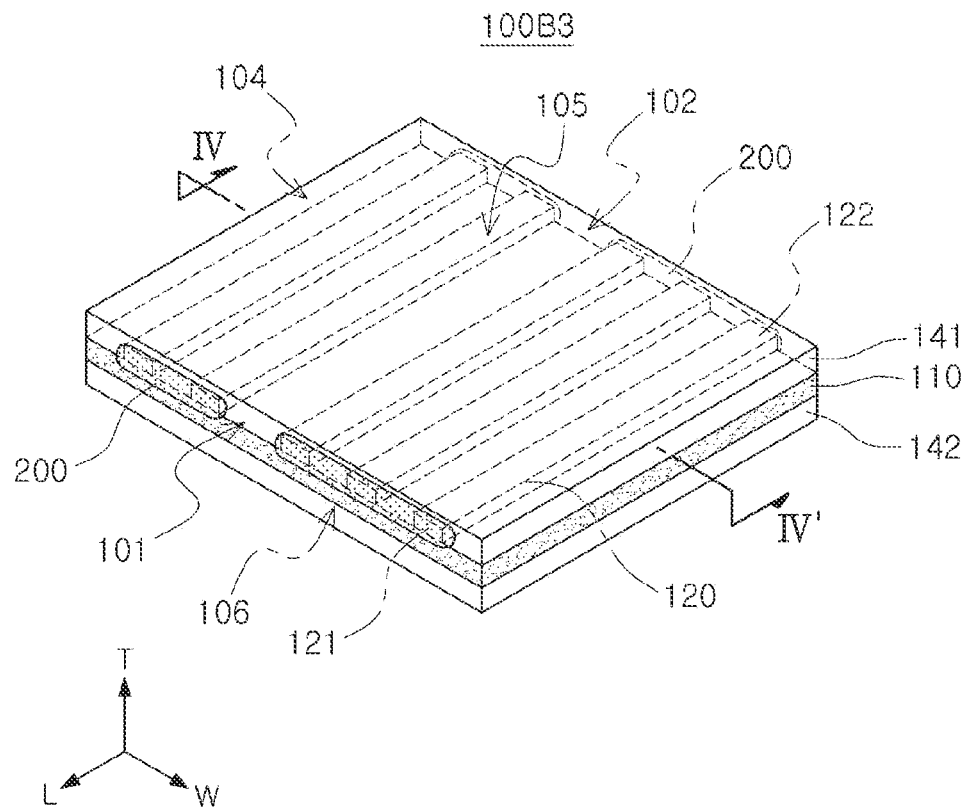
FIG. 14 is a schematic perspective view illustrating another modified example of the connection substrate of FIG. 11.
Figure 15:
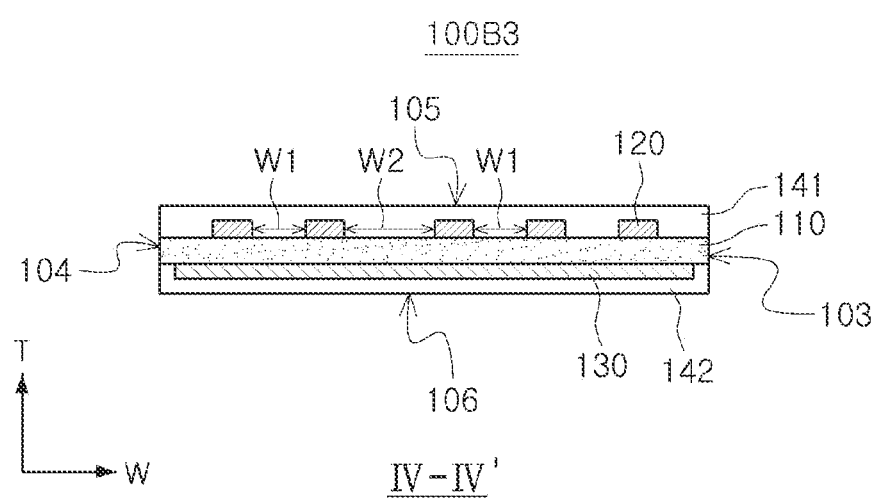
FIG. 15 is a cutaway plan view taken along line IV-IV' in another modified example of the connection substrate of FIG. 14.

FIG. 14 is a schematic perspective view illustrating another modified example of the connection substrate of FIG. 11, and FIG. 15 is a cutaway plan view taken along line IV-IV' in another modified example of the connection substrate of FIG. 14.

A connection substrate 100B3 according to another modified example of FIG. 14 has a different arrangement structure of the electrical connection metal 200 compared to the connection substrate 100B2 according to the modified example. Accordingly, with respect to other overlapping configurations, the description of the connection substrate 100B2 according to the modified example described above may be equally applied.

Referring to FIG. 14, in the case of the connection substrate 100B3 according to another modified example, the electrical connection metal 200 may be disposed on a plurality of end surfaces where the circuit pattern 120 is exposed.

Specifically, as illustrated in FIG. 14, one electrical connection metal 200 may be disposed on the first surface 101 of the connection substrate 100B3 while covering a plurality of end surfaces 121 to electrically connect the end surfaces 121 of the plurality of circuit patterns 120. In FIG. 14, a plurality of electrical connection metals 200 are disposed to cover the end surfaces 121 of two and three circuit patterns 120, respectively, but this is only an example.

Meanwhile, although not illustrated, the electrical connection metal 200 may also be disposed on the second surface 102 of the connection substrate 100B3, and likewise in this case, one electrical connection metal 200 may be disposed while covering a plurality of end surfaces 122 to electrically connect the end surfaces 122 of the plurality of circuit patterns 120.

According to such a structure, a plurality of adjacent circuit patterns 120 may be electrically connected through a single electrical connection metal 200, so that a signal transmission distance may be shortened and a more diverse design is possible. For example, by connecting a plurality of adjacent circuit patterns 120 transmitting the same signal with a single electrical connection metal 200, resistance during signal transmission may be reduced. By using a plurality of circuit patterns 120 as a transmission path for the same signal, when a problem such as a defect occurs in one circuit pattern 120, signal transmission is possible through another circuit pattern 120 connected through the same electrical connection metal 200, and thus the reliability and stability of signal transmission may be improved.

FIG. 15 illustrates a cutaway plan view of the connection substrate 100B3 according to another modified example of FIG. 14 taken along line IV-IV'. When the plurality of adjacent circuit patterns 120 are connected by the single electrical connection metal 200 as illustrated in FIG. 14, a separation distance between the circuit patterns 120 connected by the same electrical connection metal 200 may be shorter than a separation distance between the circuit patterns 120 connected to different electrical connection metals 200.

Therefore, a separation distance W1 illustrated in FIG. 15 may be shorter than a separation distance W2. By such a structure, a separation distance between paths for transmitting the same signal may be short, and a separation distance between paths for transmitting different signals may be large, so that noise generation between the paths for transmitting different signals may be relatively reduced. Meanwhile, although not limited thereto, even when the plurality of adjacent circuit patterns 120 are connected by the single electrical connection metal 200 as illustrated in FIG. 8, all of the separation distances between the respective circuit patterns 120 may be the same.

Although not illustrated, the interposer substrate 300B3 according to the modified example may have a structure in which the connection substrate 100B3 according to another modified example is attached to the metal member 10 instead of the connection substrate 100B1 according to another example, and for the description of other configurations, the description of the interposer substrate 300B1 according to another example may be equally applied.

Other contents are substantially the same as described above, and overlapping contents will be omitted.

Herein, a side portion, a side surface, and the like are used to refer to a left and right direction or a surface in the direction in relation to the drawing for convenience, an upper side, an upper portion, an upper surface, and the like are used to refer to an upward direction or a surface in the direction in relation to the drawing for convenience, and a lower side, a lower portion, a lower surface, and the like are used to refer to a downward direction or a surface in the direction for convenience. In addition, a phrase "positioned at the side portion, the upper side, the upper portion, the lower side, or the lower portion" has been used as a concept including a case in which a target component is positioned in a corresponding direction, but does not directly contact a reference component, as well as a case in which the target component directly contacts the reference component in the corresponding direction. However, these directions are defined for convenience of explanation, and the claims are not particularly limited by the directions defined as described above, and the concept of the upper portion and the lower portion may be changed at any time.

The meaning of a "connection" of a component to another component in the present disclosure includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The expression "an example" used in the present disclosure does not mean the same embodiment as each other, and is provided to emphasize and describe each different unique feature. However, the examples presented above are not excluded from being implemented in combination with features of another example. For example, even if a matter described in a specific example is not described in another example, it may be understood as a description related to another example unless there is a description opposing or contradicting the matter in another example.

The terms used in the present disclosure are used only to describe an example, and are not intended to limit the present disclosure. In this case, singular expressions include plural expressions unless the context clearly indicates otherwise.

As set forth above, according to the exemplary embodiments in the present disclosure, the connection substrate and the interposer substrate including the same capable of reducing the mounting area occupied by the connection substrate and/or the interposer substrate may be provided.

The connection substrate advantageous for electromagnetic interference (EMI) shielding and the interposer substrate including the same may be provided.

While exemplary embodiments have been shown and described above, it will be apparent to those skilled in the art that modifications and variations could be made without departing from the scope of the present invention as defined by the appended claims.

What is claimed is:

1. An interposer substrate comprising:
   a metal member; and
   a connection substrate disposed on at least portion of one side surface of the metal member,
   wherein the connection substrate includes circuit patterns exposed from each of one surface of the connection substrate and the other surface of the connection substrate opposing the one surface, and
   one of a plurality of side surfaces of the connection substrate connecting one side and the other side of the connection substrate is attached to at least a portion of the one side surface of the metal member.

2. The interposer substrate of claim 1, wherein the metal member has a stepped shape in at least a portion thereof.

3. The interposer substrate of claim 1, wherein the circuit patterns extend from the one surface of the connection substrate to the other surface of the connection substrate.

4. The interposer substrate of claim 1, wherein at least one of the plurality of side surfaces of the connection substrate is orthogonal to one of the one surface and the other surface of the connection substrate.

5. The interposer substrate of claim 1, wherein the connection substrate further comprises a core layer having one surface in contact with the circuit patterns, and a ground pattern disposed on the other surface of the core layer that is a surface opposite to the one surface of the core layer.

6. The interposer substrate of claim 5, wherein the connection substrate includes:
   a first protective layer disposed on the one surface of the core layer to cover the circuit patterns, and
   a second protective layer disposed on the ground pattern.

7. The interposer substrate of claim 6, further comprising an adhesive layer disposed between the metal member and the connection substrate,
   wherein the first protective layer is in contact with the adhesive layer.

8. The interposer substrate of claim 6, wherein the first protective layer includes an organic insulating material and is in contact with at least a partial region on the one side of the metal member.

9. The interposer substrate of claim 6, wherein the remaining surfaces except for surfaces in which the ground pattern is in contact with the core layer and the second protective layer are exposed to the outside of the connection substrate.

10. The interposer substrate of claim 6, wherein the second protective layer covers the remaining layers except for a surface in contact with the other surface of the core layer among outer surfaces of the ground pattern.

11. The interposer substrate of claim 1, further comprising another connection substrate disposed on at least portion of the other side surface opposing the one side surface of the metal member.

12. The interposer substrate of claim 1, further comprising a plurality of electrical connection metals disposed on at least a portion of the circuit patterns exposed from each of the one surface and the other surface of the connection substrate.

13. The interposer substrate of claim 12, wherein the circuit patterns are disposed to be spaced apart from each other, and
   at least one of the plurality of electrical connection metals is in contact with two or more adjacent circuit patterns among the circuit patterns.

14. The interposer substrate of claim 12, wherein the circuit patterns are disposed to be spaced apart from each other,
   one of the plurality of electrical connection metals is in contact with two or more adjacent circuit patterns among the circuit patterns, and
   a distance W1 between the two or more adjacent circuit patterns is less than a distance W2 between one of the two or more adjacent circuit patterns and another circuit pattern, which is in contact with another of the plurality of electrical connection metals, among the circuit patterns, and
   the one of the plurality of electrical connection metals and the another of the plurality of electrical connection metals are two immediately adjacent electrical connection metals among the plurality of electrical connection metals.

15. The interposer substrate of claim 1, wherein the metal member has a closed loop shape.

16. The interposer substrate of claim 15, wherein regions in which the circuit patterns are exposed from the one surface and the other surface of the connection substrate are coplanar with the one surface and the other surface of the connection substrate, respectively.

17. A connection substrate comprising:
   a core layer;
   a circuit pattern and a ground pattern disposed on one surface and the other surface of the core layer, respectively; and
   first and second protective layers disposed on the one surface and the other surface of the core layer, respectively, to cover the circuit pattern and the ground pattern, respectively,
   wherein the second protective layer covers the remaining surfaces except for a surface in contact with the other surface of the core layer among outer surfaces of the ground pattern, and
   at least a portion of the circuit pattern is exposed through at least a portion of each of two opposing side surfaces of the connection substrate.

18. The connection substrate of claim 17, further comprising electrical connection metals respectively disposed on portions of the circuit pattern exposed from the two opposing side surfaces of the connection substrate.

19. An interposer substrate comprising:
   a metal member including a first portion and a second portion bent with respect to the first portion; and
   a connection substrate disposed on the first portion,
   wherein the connection substrate includes circuit patterns exposed from each of one surface of the connection substrate and the other surface of the connection substrate opposing the one surface,
   the connection substrate further includes a ground pattern, and
   the circuit patterns are disposed between the ground pattern and the first portion.

20. The interposer substrate of claim 19, wherein the connection substrate further comprises a core layer, and a first protective layer and a second protective layer respectively disposed on opposing surfaces of the core layer, to respectively cover the circuit patterns and the ground pattern.

* * * * *